(12) United States Patent
Liu

(10) Patent No.: US 6,801,557 B2
(45) Date of Patent: Oct. 5, 2004

(54) LASER DRIVER FOR A LASER SENSING SYSTEM

(76) Inventor: Gang Liu, 41811 Ridge Road East, Novi, MI (US) 48375

(*) Notice: Subject to any disclaimer, the term of this patent is extended or adjusted under 35 U.S.C. 154(b) by 45 days.

(21) Appl. No.: 09/827,764

(22) Filed: Apr. 6, 2001

(65) Prior Publication Data

US 2002/0141461 A1 Oct. 3, 2002

Related U.S. Application Data

(60) Provisional application No. 60/195,886, filed on Apr. 7, 2000.

(51) Int. Cl.[7] .................................. H01S 3/00
(52) U.S. Cl. .................. 372/38.09; 372/38.02; 372/38.03; 372/38.04; 372/38.07
(58) Field of Search ............... 372/38.09, 29.015, 372/29.012, 38.02, 38.04, 38.07, 34, 36, 38.03

(56) References Cited

U.S. PATENT DOCUMENTS

| | | | |
|---|---|---|---|
| 5,138,340 A | * | 8/1992 | Sprague et al. ............ 346/108 |
| 5,579,328 A | | 11/1996 | Habel et al. ................. 372/31 |
| 5,594,748 A | * | 1/1997 | Jabr ......................... 372/38.09 |
| 5,754,574 A | * | 5/1998 | Lofthouse-Zeis et al. ..... 372/34 |
| 5,816,535 A | * | 10/1998 | Underwood, Jr. et al. ................ 244/137.3 |
| 5,821,527 A | * | 10/1998 | Rudd et al. ................ 250/205 |
| 5,872,624 A | * | 2/1999 | Chambers et al. ......... 356/73.1 |
| 5,966,394 A | | 10/1999 | Spurr et al. .................. 372/34 |
| 5,999,549 A | * | 12/1999 | Freitag et al. ........... 372/38.09 |
| 6,097,744 A | * | 8/2000 | Takigawa et al. ............ 372/34 |
| 6,110,644 A | * | 8/2000 | Vermeersch et al. ........ 430/302 |
| 6,178,188 B1 | * | 1/2001 | Jing et al. .................... 372/36 |
| 6,292,498 B1 | * | 9/2001 | Pfaff .......................... 372/32 |
| 6,229,833 B1 | * | 5/2002 | Noda et al. ............. 372/38.09 |

* cited by examiner

Primary Examiner—Don Wong
Assistant Examiner—James Menefee
(74) Attorney, Agent, or Firm—Dinnin & Dunn, P.C.

(57) ABSTRACT

A laser driver for laser sensing system having two lasers on a single PCB, thermo-electric temperature control, rapid activation, and pulse power and duration safety tables embedded in the microprocessor controller.

14 Claims, 3 Drawing Sheets

US 6,801,557 B2

LASER DRIVER FOR A LASER SENSING SYSTEM

Continuation of Provisional Application Ser. No: 60/195,886 Filed: Apr. 7, 2000.

BACKGROUND OF THE INVENTION

The invention relates to the use of lasers in inspection systems or other sensing systems, particularly laser systems which can detect the three-dimensional position of a mechanical part in an assembly line. Such sensing systems require a laser projector to generate and direct a sensing beam and an image receiver to collect the beam reflected from the object being inspected or "sensed". There are well known devices (cameras) for collecting and processing the reflected beam, and apparatuses for focusing and directing the laser beam are available.

The present invention is directed to the laser driver for a laser sensing system. The laser driver is the portion of the sensing system which controls the generation of the laser beam. Currently, the preferred method of generating the laser beam is by use of a laser diode.

There were several problems in laser driver designs which existed prior to the present invention. A specific problem was the initial setting of the laser power, which had typically been accomplished through manual adjustment of a dial type potentiometer. A related problem has been accurate temperature control of the laser diode, as minor temperature changes will effect the wave length of the laser beam generated by the laser diode. It has been known to utilize an electric heater to maintain a minimum operating temperature, and it has been suggested that a TEC (thermoelectric cooler) could be utilized in connection with a laser driver for stabilizing the laser diode temperature which can be higher or lower than the ambient temperature. However, it is believed that, in spite of the need and suggestion, no cost effective apparatus has been designed to fit within the space confines provided for a laser driver, and particularly not in conjunction with the other features of the present invention.

Current laser sensing systems of the type described herein typically utilize a single laser beam due primarily to the cost and space constraints. The use of two laser beams greatly improves the sensing capabilities (resolution and accuracy) of the system, but has required two laser drivers or at least two separate PCBs (Printed Control Boards), one for each laser diode.

Laser diode technology is rapidly improving, and regularly produces more efficient, reliable, durable and powerful diodes. In current laser driver designs, the circuit is designed to handle one of two standard diode configurations, and will not accommodate the other configuration, thus eliminating from use a group of laser diodes which may have superior properties for a particular application.

An important concern in the laser sensing systems at issue is speed. Available laser drivers provide response times (turning the laser on to specification) in excess of 500 ms (½ sec.). Improving response time provides additional time for the system to conduct the measurement or sensing operation and speeds up the entire sensing process.

A significant issue with respect to any laser based system is safety. However, current systems rely entirely upon a simple on-off circuit and do not monitor the condition of the laser diode. These systems cannot take advantage of the increased peak power available from a laser diode if the diode is pulsed rather than activated at a constant level (continuous waves).

DETAILED DESCRIPTION OF THE PREFERRED EMBODIMENT

Figure 1:
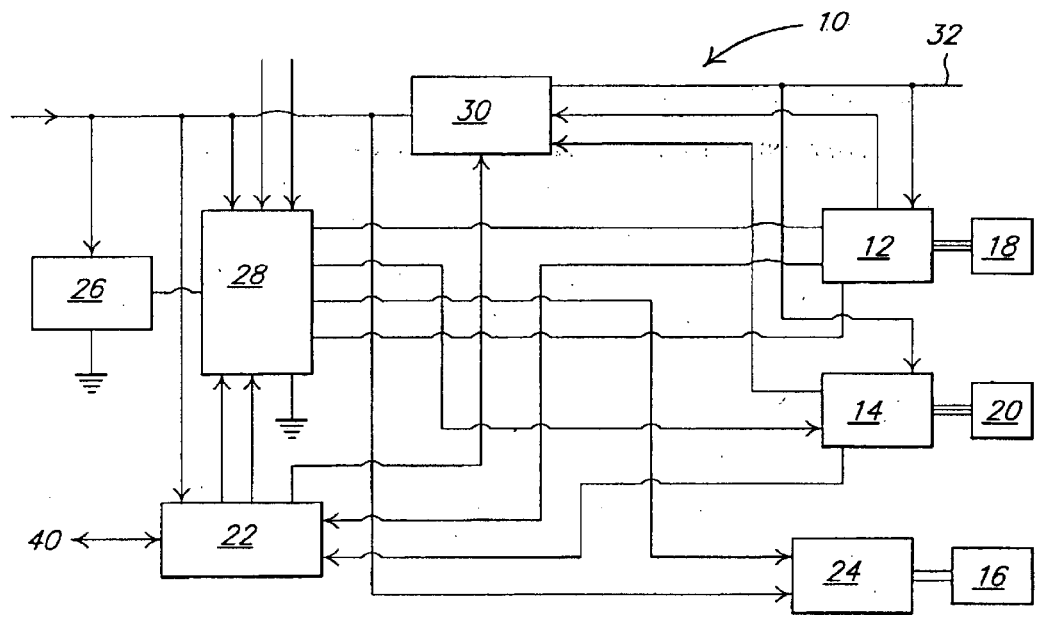
FIG. 1 is a schematic diagram of a laser driver according to the present invention.

The present invention is the design of a laser driver which solves the problems and concerns detailed above by including features heretofore not used in the art or not used in combination. The general PCB layout for the laser driver of the present invention is shown at 10 in FIG. 1 which contains two laser drivers 12 and 14 and a TEC 16 in a space significantly smaller than PCB's for current laser drivers utilizing a single laser diode and only a heating mechanism. The laser drivers 12 and 14 control activation (pulsing) of laser diode devices 18 and 20. The laser diode is mounted upon the TEC, which in turn is mounted upon a heat sink. A thermistor is mounted on the top of the TEC with the laser diode. The thermistor's leads are connected to the host (remote) computer, for monitoring the temperature of the laser diode and adjusts the TEC to maintain the temperature of the laser diode within one degree or less accuracy to a temperature set-point, cooling as much as 20° C. cooler than ambient temperature or 40° C. warmer than ambient temperature. TECs to accomplish this control are commercially available. The TEC is controlled by a TEC driver 24.

The Laser/TEC Driver Circuit is composed of a precision reference voltage generator 26, a multiple outlet D/A (Digital-to-Analog) converter 28 (contained in the same package with the microprocessor 22 as an IC (Integrated Circuit) chip), an electronic power supply switch 30, a TEC (or heater) driver 24, two laser drivers 12 and 14, a two channel laser current sensing circuit, and a microprocessor 22.

The two laser diode devices 18 and 20 are physically mounted on the so-called cold side of the TEC or the hot side of the heater, depending on which one is used, a TEC or a heater. In applications that the set-point temperature of the laser diodes needs to cover the temperature both lower and higher than the ambient temperature, a TEC must be used which may be more costly than using a heater. In the applications where the set-point temperature is always higher than the ambient temperature, a heater can be used.

Through the D/A converter 28, the microprocessor 22 sets the set-point temperature of the cold side of the TEC or the hot side of the heater, the output current limit for the laser diodes, and the output powers of the diode laser devices 18 and 20. The microprocessor 22 is connected to a remote console at 40 for bidirectional communication.

The laser 18 and 20 can be turned on and off independently. Dragging the input control pins to 0 Volt turns the laser off, leaving the pin unconnected or pulling it to VDD (the positive rail of the power supply) 32 turns the laser on.

Figure 2:
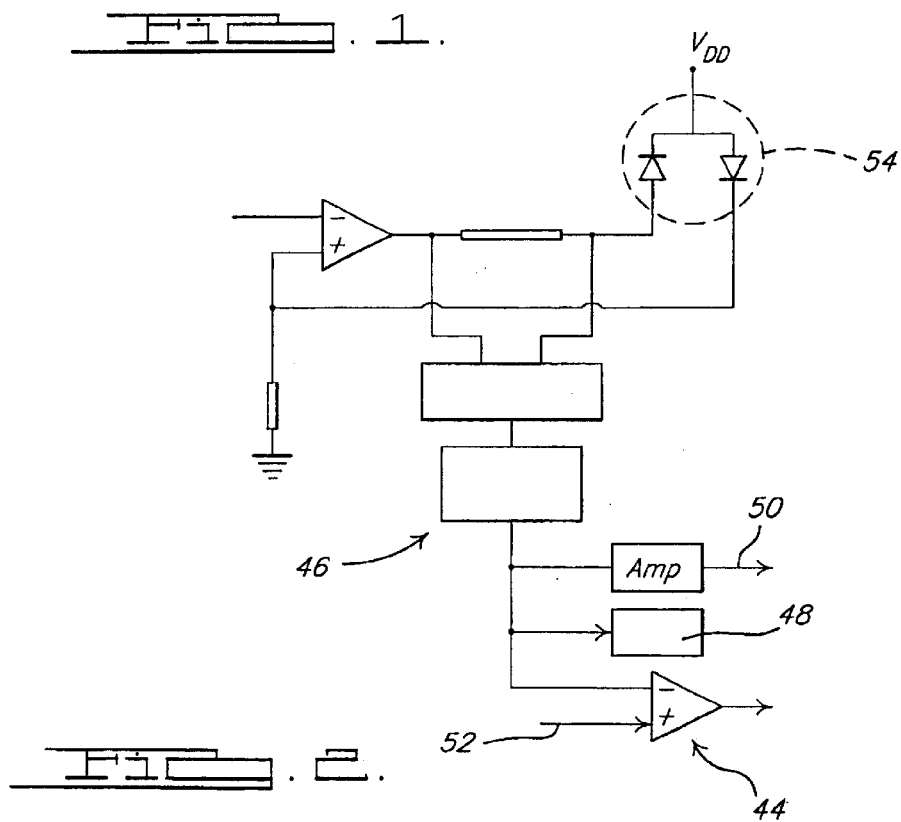
FIG. 2 is a diagram of a sensing circuit used according to the preferred embodiment.

FIG. 2 illustrates the current sensing circuit (which is contained in the laser driver circuit in FIG. 1), which senses the laser current and sends the signal 50 to the microprocessor 22 so that the microprocessor knows when the laser is turned on or off. It also sends the signal to a comparator 44. When the output voltage of the current sensing circuit 46 which is proportional to the laser current, exceeds the preset threshold voltage 52 set by the microprocessor through the D/A converter 28, the comparator flips its output and turns off the electronic switch controlling the power supply. The output voltage is also sent to the A/D converter input of the microprocessor so that the microprocessor 48 knows the current going through the laser diodes.

The function of turning off the power when the laser current reaches a preset value makes up one protection layer for the laser diodes generally 54 from the input voltage 52. So that when the power control loop fails that causes the output current to the laser diodes to exceed the maximum allowed value, the laser diodes are safely protected.

Since this protection layer is independent from the automatic power control circuit, when any single component in the automatic power control circuit fails, this protection layer protects the laser diodes from being damaged by being over driven to a large current. At the same time, when any one component in this protection layer (the current sensing circuit, the comparator, and the electronic power supply switch) fails, the automatic power control circuit can still work and protect the laser diode. Therefore, when any single component in the whole driver circuit fails, the laser diodes will be safely protected. This is called fail-safe feature or driver level fail-safe feature. Since laser sensing devices are typically used in the presence of humans (such as manufacturing plants or assembly lines), preventing human overexposure to laser light is critical.

In some applications, the laser outputs are set to certain power levels of which the maximum continuous on times are regulated by the laser safety standards. The host computer that turns the lasers on and off should follow the standards and limits laser-on time length within the maximum values allowed. However, sometimes when the host computer may be wrongly programmed or the hardware gets problems, the lasers are not turned off after reaching the maximum on time length. In this case, the microprocessor on the driver turns the lasers off. Thus, the safety standard will be observed. The microprocessor is programmed to know the power it sets on each laser, knows when the laser is turned on through the current sensing circuit, also knows the maximum duration allowed at that power by the laser safety standard. When the laser is turned on by the host computer, the microprocessor starts counting the time. When the on time reaches the limit, the microprocessor turns off the electronic power supply switch 30 so that the lasers are forced to turn off. This feature allows safe maximization of the laser output power while keep laser safety standards from being violated. With this feature, any single system component, the host computer software, the host computer hardware, said laser driver software, or said laser driver hardware fails the safety standards will not be violated. This safety feature is called system level fail-safe feature.

To simplify calculations in the microprocessor, a power-safety table is stored in its memory. After knowing the set output powers, a look up in this power safety table will obtain the maximum on time length allowed at that output power. Without this safety table, a lengthy calculation would be required which takes more time and memory space in the microprocessor.

An important feature of the driver of the present invention is its response time. Said laser driver has a unique way of reducing the rise and fall times. That is, the laser is turned off by setting the target current of the monitor photo diode close to zero and the control loop is still monitoring the laser output power. Thus the control loop is kept "alive" all the time, regardless of the laser on and off status. So that when turning on and off the laser, since it is kept alive all the time, the control loop takes much shorter time to reach the equilibrium point. The conventional way of turning off the laser is by shutting off the driving current of the laser diode. The control loop is completely shut off when laser is off. So that when turning on and off the laser, the control loop has to be turned on and turned off which takes tremendous amount of time. Thus, by using the conventional way, it would take much longer time to turn on and off the laser, resulting in a much longer rise and fall times. Prior laser driver designs turn the entire control circuit off when the laser is "off", and the response time between generation of the "on" signal and laser diode activation is typically 0.5 sec (500 ms) or more. The present design merely reduces the current through the circuit in the "off" state so that the laser diode does not have enough current to generate visible light. Thus, whenever the driver module has power (the sensing system is "on"), the control circuit is active. Thus, when the laser is to be turned on, the response time is as low as 1 ms.

Figure 3A:
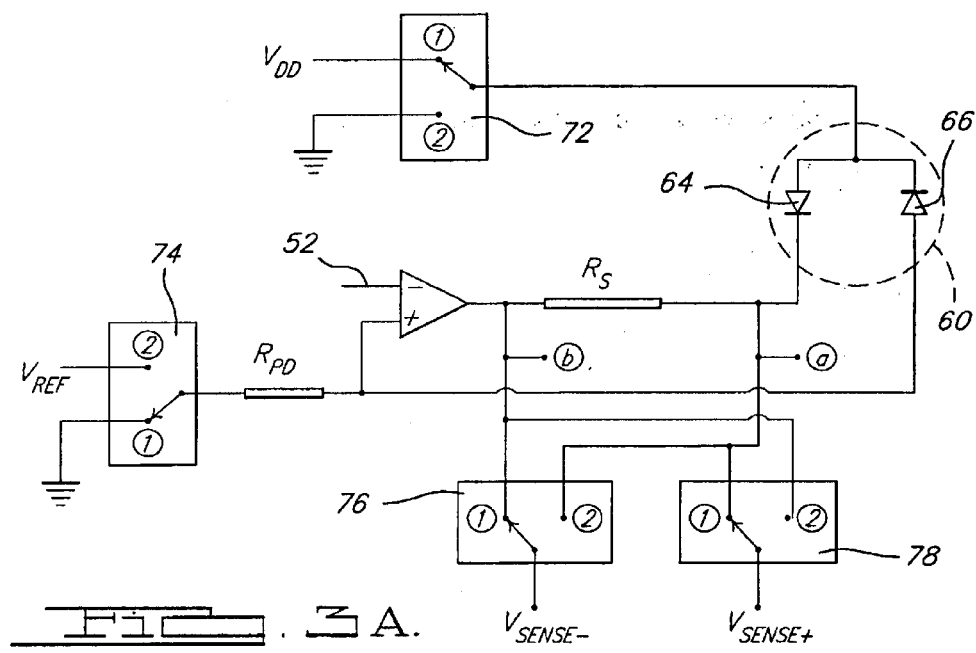
FIG. 3A and 3B are diagrams of alternate configurations of a circuit to accommodate either of two standard diode configurations.
Figure 3B:
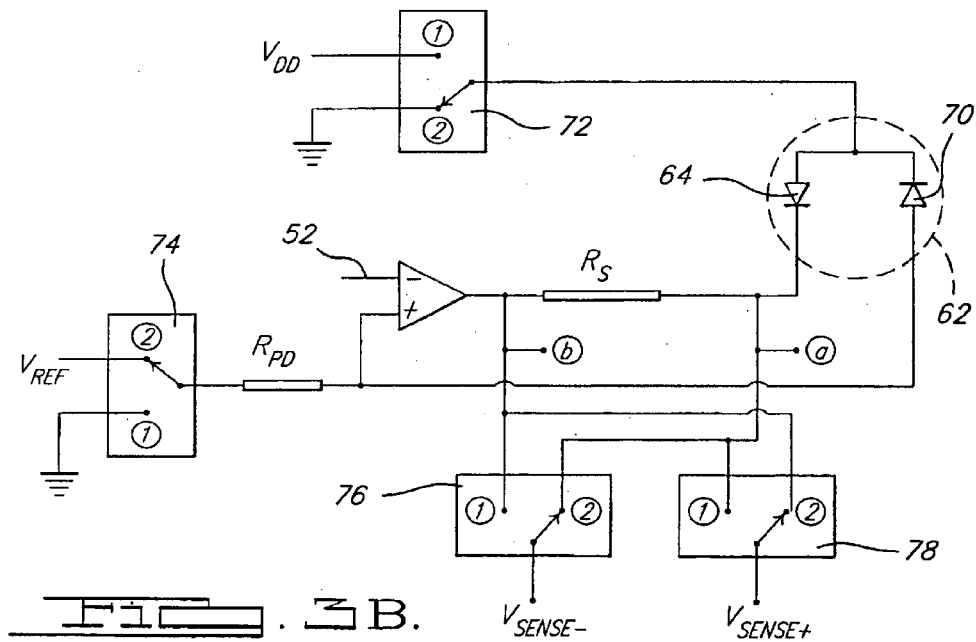
Figure 4:
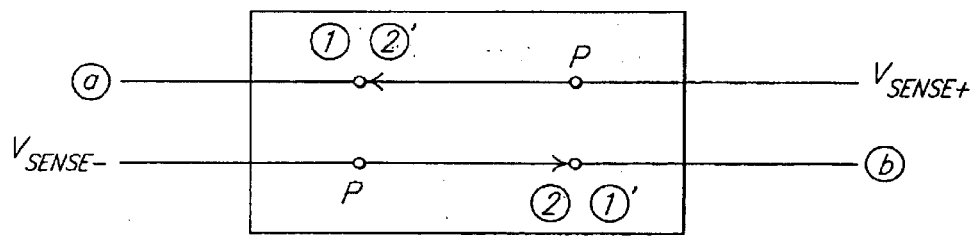
FIG. 4 and 4A are diagrams of switch positions of switches in the circuits of FIGS. 3A and 3B.
Figure 4A:
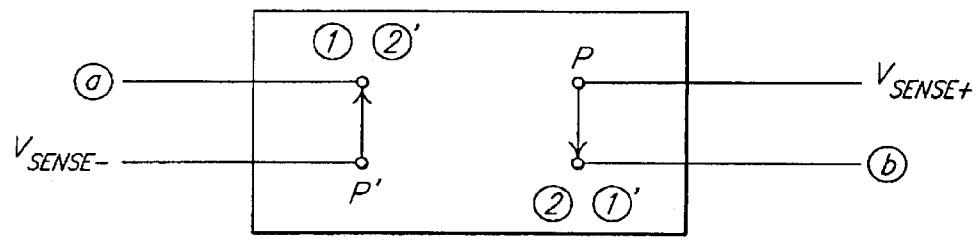

FIGS. 3A and 3B illustrate features of the present invention, the flexibility to accommodate either of the current laser diode configurations available. Said laser driver provides another unique feature. That is, it can drive laser diode devices 60 and 62 of different configurations by simply changing some switches on the driver PCB in hardware. These switches can be made of regular solder pads on the PCB, the same as the solder pads for electronic components, which minimizes cost and take a very small amount of PCB space. FIG. 3A shows the circuit with all the switches in the positions for driving the laser diode device of one configuration (laser diode 64 and photo diode 66) and FIG. 3B shows the same circuit with the switches in the positions for driving the laser diode device of another configuration (laser diode 68 and photo diode 70). When configuring the switches 72, 74, 76 and 78, simply solder some of the pads together as the switch pole touching contact or not solder the pads together as the switch pole not touching the contact. To reduce the PCB area the switches take, Switches 76 and 78 can be combined into one switch of which the circuit is shown in FIG. 4 in one position and in FIG. 4A in a second position, for driving the laser diode devices with two different configurations.

Another advantage of the present invention is the automatic adjustment of the laser output and the precision of the laser output adjustment. Rather than utilizing a manually controlled potentiometer, a communication link is provided between the system host computer and the control circuit. The initial power output can be adjusted in defined increments. The increments can be made very small through this technique, but it has been found that 255 steps (256 settings) is sufficient for most applications. For example, with two 5 mw laser diodes, the controller can break the setting into 0.04 mw increments.

Still another important advantage can be derived by utilizing a control link between the control circuit and the host computer. Laser diodes have safety limits for pulse durations and power output. By providing a serial communication link between the laser diodes and the host computer, the laser driver module can record and store the gain characteristics of each diode. In particular, the output power, pulse start time and pulse stop time are recorded. From this, the host computer calculates the pulse duration and pulse repetition frequency (PRF). In order to enable the computer to observe laser safety, known values from safety tables for pulse output power and duration, and repetition frequency are entered into the computer and the computer is instructed to approximate an equation best fitting the input values using well known arithmetic functions. This is comparable to plotting points on a graph and fitting a curve to include each of the points. At least three points are required, and preferably five, as input, including a point near the high and another near the low ranges (the practical "end" points on the curve). The computer digitally performs this function, thus producing equations which will provide a safety time limit for pulses of given power output or repetition frequency.

In this manner, the laser driver module can monitor one or more laser diodes to ensure safety. This provides additional security even when this laser is not pulsed (continuous wave) by providing a fail-safe feature. However, this design enables the system to utilize higher output power by pulsing the laser diodes while still maintaining the safety of the system. This fail-safe circuit is independent of the primary driver circuit and overrides the control link to shut off a laser diode when appropriate. Thus, the module may also be protected against electrical shorts in the driver circuit by monitoring the photo diode feedback in the control circuit, which is always kept energized. At setup, the photo diode feedback is recorded at various output power settings to initialize the system.

Figure 5:
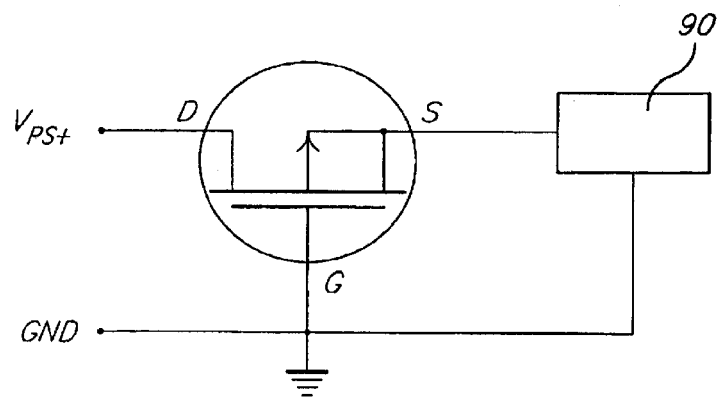
FIG. 5 is a schematic view of a low dropout voltage polarating protection circuit.

The laser driver is preferably provided with a unique low drop out voltage protection circuit which is shown in FIG. 5. This circuit uses a P-channel power MOSFET (Metal Oxide Silicon Field Effect Transistor) Q. When the polarity is correct, i.e. VPS+ is higher than the ground (GND) in potential, Q is turned on. Otherwise, when the input power supply polarity is wrong (reversed), i.e. VPS+ is lower than GND in potential, Q is turned off. This circuit is simple, low cost, and, in addition, the drop out voltage is low, usually 0.1 Volt or less. Comparing with a protection circuit built using a diode (the drop out voltage would be at least 0.3 Volt), this circuit consumes 3 or more times less power and passes the power supply voltage to the laser driver circuit without much power supply voltage being dropped out.

Said laser/TEC driver can drive one or multiple laser diodes and a TEC or a heater or multiple TEC's and/or heaters. The microprocessor of said laser/TEC driver monitors the lifetime left in the laser diode(s) and the TEC. The principle used for monitoring the laser diode is that as the laser diode ages, the driving current needed at one temperature for outputting a certain power is increased compared with the current needed initially when the laser diode is new at the same temperature for outputting the same power. When calculating the life strength of the laser diode, the laser diode temperature at which the current is measured is therefore taken into account as well. The measurement is done through the current sensing circuit and the measured voltage which is proportional to the current sent to the A/D (Analog-to-Digital) converter embedded in the microprocessor. After the measurement and the calculation is done, the values about the laser diodes' life time left are sent to the host computer through the communication channel. These can be displayed on the monitor screen of a PC computer which either communicates with the host computer to obtain these values or serves as the host computer.

The principle used in monitoring the TEC is that as the TEC ages, the driving current needed for generating the same amount of heat (or cold) is increased. The current is measured by the current sensing circuit which is similar to that shown in FIG. 2 and the voltage proportional to the current is sent to the A/D converter of the microprocessor.

Each said laser/TEC driver is given two serial numbers which are stored in the EEPROM of the microprocessor. The first one is given when it is manufactured. This number represents the information about the manufacturing, such as the date it is manufactured its version names, the major components used, etc. The second serial number is given when the driver is tested and to be shipped out with the final product which uses the laser driver. This number reflects the application information about the driver, such as the date the driver is finally tested and configured, the customer for which the final product (which uses this driver) is made, the configuration information on this driver, etc.

Additional benefits and advantages of the present invention will become apparent to those skilled in the art to which the present invention relates from the subsequent description of the preferred embodiment taken in conjunction with the accompanying drawings.

What is claimed is:

1. A laser driver for generating coherent light comprising:
   at least two laser diodes mounted in combination with a single thermo-electric temperature control means; and
   a microprocessor for controlling and/or monitoring the activation of said laser diodes and said thermo-electric temperature control means;
   a control circuit connected to an input power supply for the laser diodes having a MOSFET which is turned on when a power supply voltage is higher than ground and turned off when a power supply polarity is reversed and power supply voltage drops below ground, thereby turning off the laser diodes;
   wherein said laser diodes are operable to simultaneously provide laser beams.

2. A method of controlling and/or monitoring a laser diode with a microprocessor having memory for storage of date, the method comprising:
   storing in said memory power-safety parameters of said laser diode with said microprocessor during operation of said laser diode;
   continuously monitoring said laser output power;
   continuously monitoring laser pulse duration; and
   calculating cumulative laser output power over time based on laser pulse peak output power and pulse duration;
   disabling operation of said diode whenever the cumulative laser output power exceeds a predetermined limit.

3. The method of claim 2 further comprising a step of reenabling operation of said laser diode upon the occurrence of a predetermined contingency.

4. The method of claim 2 wherein said parameters include laser pulse duration and laser pulse peak output power during pulsed mode laser operation.

5. The method of claim 4 wherein said parameters include laser pulse duration said laser pulse peak output power.

6. The method of claim 4 wherein said microprocessor records the output power of said laser diode when said laser diode is activated.

7. The method of claim 2 wherein a plurality of discrete power safety parameter limits are stored in said microprocessor and said microprocessor extrapolates a curve for determining said parameter limits for each input parameter.

8. A laser driver control system comprising:
   a remote microprocessor;
   a laser driver printed control board;
   a microprocessor on said printed control board;
   at least one laser driver and a corresponding laser diode on said printed control board; and a serial communication between said host microprocessor and said laser driver;

temperature control means operable to ameliorate temperature change of the laser diode, said temperature control means controlling a temperature of said laser diode within a range of about one degree from a temperature set point, corresponding to a desired output wavelength range of said laser diode;

wherein said host microprocessor is programmed to set a set point temperature of the temperature control means.

9. The system of claim 8 further comprising a thermo-electric temperature regulating device.

10. The system of claim 9 further comprising a heat sink thermally connected to said thermo-electric temperature regulating device.

11. The system of claim 8 comprising a plurality of laser drivers on said printed control board and corresponding laser diodes.

12. A method of controlling a laser diode comprising:

setting a temperature set point for the laser diode, said temperature set point corresponding to an output wavelength;

activating a control circuit that includes said laser diode at a current level less than the current threshold to activate said laser diode;

activating said laser diode by increasing the current in said control circuit above said threshold for a specified duration; and reducing said current below said threshold to deactivate said laser diode;

operating temperature control means to ameliorate changes in the output wavelength of the laser diode during plural consecutive activations thereof, thereby maintaining the output wavelength of said laser diode within a predetermined range during diode operation.

13. A laser driver control system comprising:

at least one laser diode, a circuit for sensing the current through said laser diode, comparator for continuously comparing said current to a predetermined value, and power supply switch for disabling said current to said laser diode if said current exceeds said value;

a power control circuit loop including the components of said sensing circuit, said comparator and power supply switch operably connected to a microprocessor to positively verify operation of said components, and means to disable said laser diode if operation of any of said components is not positively verified; and a remote computer monitoring the pulse frequency, magnitude and duration of said laser diode and means to disable said laser diode if predetermined pulse and duration values are exceeded; and means to disable said laser diode if predetermined product values of pulse magnitude and pulse duration are exceeded.

14. A laser driver control circuit containing P-channel MOSFET connected to the power input of said circuit which allows the preselected input power polarity to pass and which turns off if an opposite input power polarity is received, thereby turning off power through the circuit, the MOSFET comprising a body diode that is forward biased with respect to the preselected input polarity.

* * * * *